(12) United States Patent
Song

(10) Patent No.: US 12,112,817 B2
(45) Date of Patent: Oct. 8, 2024

(54) TEST METHOD, COMPUTER APPARATUS, AND COMPUTER-READABLE STORAGE MEDIUM

(71) Applicant: CHANGXIN MEMORY TECHNOLOGIES, INC., Hefei (CN)

(72) Inventor: Biao Song, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 239 days.

(21) Appl. No.: 17/827,997

(22) Filed: May 30, 2022

(65) Prior Publication Data

US 2023/0268020 A1  Aug. 24, 2023

Related U.S. Application Data

(63) Continuation of application No. PCT/CN2022/080160, filed on Mar. 10, 2022.

(30) Foreign Application Priority Data

Feb. 24, 2022  (CN) .......................... 202210177147

(51) Int. Cl.
*G11C 29/36* (2006.01)
*G11C 29/12* (2006.01)
*G11C 29/44* (2006.01)

(52) U.S. Cl.
CPC .......... *G11C 29/36* (2013.01); *G11C 29/1201* (2013.01); *G11C 29/12015* (2013.01); *G11C 29/4401* (2013.01); *G11C 2029/3602* (2013.01)

(58) Field of Classification Search
CPC ............... G11C 29/36; G11C 29/1201; G11C 29/12015; G11C 29/4401; G11C 2029/3602; G11C 29/50012; G11C 29/50016
See application file for complete search history.

(56) References Cited

U.S. PATENT DOCUMENTS

| 2003/0145260 A1 | 7/2003 | Yuan et al. |
| 2006/0203590 A1* | 9/2006 | Mori ................. G11C 29/50016 365/222 |
| 2010/0174955 A1* | 7/2010 | Carnevale .............. G11C 29/16 714/E11.169 |
| 2017/0069358 A1* | 3/2017 | Yun ................... G11C 29/50012 |

FOREIGN PATENT DOCUMENTS

| CN | 1581355 A | 2/2005 |
| CN | 106504795 A | 3/2017 |
| CN | 113160876 A | 7/2021 |

* cited by examiner

*Primary Examiner* — Uyen Smet
(74) *Attorney, Agent, or Firm* — Kilpatrick Townsend & Stockton LLP

(57) ABSTRACT

Embodiments relate to a test method, a computer apparatus, and a computer-readable storage medium. The test method includes: writing first data into a target memory cell; performing reverse writing on the target memory cell; reading second data stored in the target memory cell after the reverse writing; determining whether the second data are the same as the first data; and determining that write recovery time of the target memory cell fails when the second data are the same as the first data. The present disclosure can make an effective test of determining whether the write recovery time fails.

17 Claims, 7 Drawing Sheets

Fig. 7

TEST METHOD, COMPUTER APPARATUS, AND COMPUTER-READABLE STORAGE MEDIUM

CROSS-REFERENCE TO RELATED APPLICATION

The present disclosure is a continuation of PCT/CN2022/080160, filed on Mar. 10, 2022, which claims priority to Chinese Patent Application No. 202210177147.2 titled "TEST METHOD, COMPUTER APPARATUS, AND COMPUTER-READABLE STORAGE MEDIUM" and filed to the State Patent Intellectual Property Office on Feb. 24, 2022, the entire contents of which are incorporated herein by reference.

TECHNICAL FIELD

The present disclosure relates to the field of semiconductor memory device manufacturing technology, and more particularly, to a test method, a computer apparatus, and a computer-readable storage medium.

BACKGROUND

As device feature sizes of semiconductor integrated circuits continue to shrink, critical sizes of semiconductor memory devices are also becoming smaller and smaller, and technology processes are more and more prone to defects, which may lead to various abnormal failures of memory cells. Failure of write recovery time may have a seriously adverse effect on device performance. Therefore, development of an effective test method for the write recovery time is a very critical item in the manufacturing processes of the memory devices.

SUMMARY

According to some embodiments of the present disclosure, there are provided a test method, a computer apparatus, and a computer-readable storage medium.

According to some embodiments of the present disclosure, a test method is provided, including: writing first data into a target memory cell; performing reverse writing on the target memory cell; reading second data stored in the target memory cell after the reverse writing; determining whether the second data are the same as the first data; and determining that write recovery time of the target memory cell fails when the second data are the same as the first data.

According to some embodiments, the present disclosure also provides a computer apparatus, which includes a memory and a processor, wherein the memory stores a computer program, and the computer program is executable by the processor, whereby steps of the method according to any one of the foregoing embodiments are implemented.

According to some embodiments, the present disclosure also provides a computer-readable storage medium storing a computer program thereon, and the computer program is executable by a processor, whereby steps of the method according to any one of the foregoing embodiments are implemented.

The embodiments of the present disclosure may/at least have following advantages.

In the embodiments of the present disclosure, the first data "1" (or "0") are first written into the target memory cell, and then reverse writing is performed to the target memory cell. When the CSL ON time is the standard reference time, within the CSL ON time, the discharging (or charging) process of the capacitor of the target memory cell is hindered, which may cause that the voltage reversal speed of the bit line corresponding to the target memory cell becomes slow, such that a relationship between the potential of the bit line and the potential of the complementary bit line is not reversed after the CSL time of the write recovery time of the reverse writing is ended. Within the write recovery time after the CSL time is ended, under the action of the sense amplifier between the bit line and the complementary bit line, the potential of the bit line returns to the power supply voltage Vary (or the power supply voltage Vss corresponding to the first data "0") corresponding to the first data "1". At this moment, the bit line having the power supply voltage Vary (or the power supply voltage Vss) corresponding to the first data may allow the first data to be written into the target memory cell again because the word line is turned on, such that the reverse writing to the target memory cell fails. Therefore, by reading the second data stored in the target memory cell after the reverse writing and comparing whether the second data are the same as the first data, it may be effectively determined whether the target memory cell fails due to hindered charging when the CSL ON time is the standard reference time.

Details of one or more embodiments of the present disclosure are set forth in the following drawings and descriptions. Other features, objectives, and advantages of the present disclosure will become apparent from the description, the drawings, and the claims.

BRIEF DESCRIPTION OF THE DRAWINGS

To describe the technical solutions of the embodiments of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

FIG. 7 is a schematic diagram showing a mode of writing data into a target memory array according to one embodiment.

To better describe and illustrate the embodiments and/or examples of those inventions disclosed herein, one or more drawings may be referred to. The additional details or examples for describing the drawings should not be considered as limiting the scope of any of the disclosed inventions, the currently described embodiments and/or examples, and the best mode of these inventions currently understood.

DETAILED DESCRIPTION

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure.

It is to be understood that the terms "first" and "second" used in the present disclosure are used herein to describe written data, but values of the data are not limited by these terms. These terms are merely used to distinguish the written data.

Figure 1:
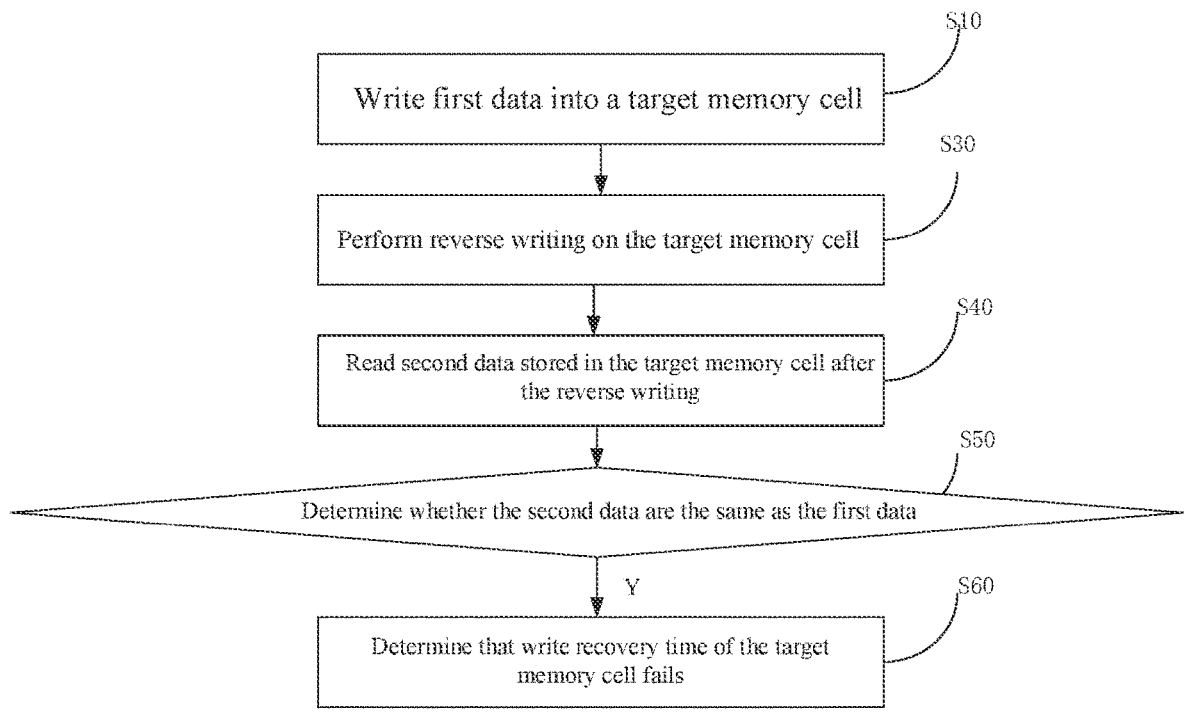
FIG. 1 is a schematic flowchart of a test method according to one embodiment.

In one embodiment, referring to FIG. 1, a test method is provided, including following steps:

Step S10: writing first data into a target memory cell;

Step S30: performing reverse writing on the target memory cell;

Step S40: reading second data stored in the target memory cell after the reverse writing;

Step S50: determining whether the second data are the same as the first data; and Step S60: determining that write recovery time of the target memory cell fails when the second data are the same as the first data.

In the Step S10, the "target memory cell" is a memory cell selected from memory cells of a memory device for testing failure of the write recovery time, where number of the target memory cells may be one or more. The memory cell includes a switching transistor and a capacitor.

The first data written into the target memory cell may be "1". Of course, the first data written into the target memory cell may also be "0", and the first data are not limited thereto.

Here, reference is made by taking an example where the first data are "1". When the memory device receives a write command to write the first data into the target memory cell, within the write recovery time, a write driver is first turned on, and then a CSL control signal is provided, such that a control transistor between a bit line and an input terminal of the target memory cell is enabled to conduct the bit line and the input terminal. Meanwhile, a word line signal of the target memory cell is turned on before that to enable the switch transistor thereof, such that the capacitor and the bit line of the target memory cell is conducted. Therefore, within the CSL ON time, the input terminal is connected to the capacitor of the target memory cell, such that the capacitor of the target memory cell is charged, and a signal of the bit line is pulled up.

After the CSL control signal is supplied for a certain period of time, the CSL control signal is turned off. The signal of the bit line of the target memory cell is amplified by a sense amplifier to be a power supply voltage corresponding to the first data. When the first data are "1", the corresponding power supply voltage is "Vary". At this moment, the bit line charges the capacitor in the target memory cell to write data into the target memory cell. The word line signal is turned off after the write recovery time.

In the Step S30, reference is made to the reverse writing process of the target memory cell by taking an example where the first data are "1".

Figure 2A:
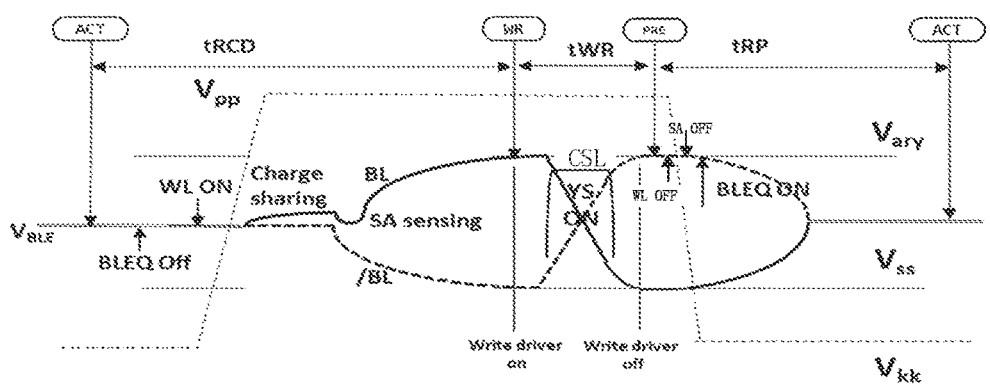
FIG. 2A is a signal timing diagram when reverse writing is performed on the target memory cell according to one embodiment.

Referring to FIG. 2A, during the data write operation, delay time (tRCD time) from a memory row address to a column address is first experienced, and then the write recovery time (tWR) is performed. Within the tRCD time, after a bit line equalization signal is turned off (BLEQ OFF), a word line is turned on (WL ON), and a voltage of the word line rises from VKK to VPP, such that memory cells perform charge sharing, and charges on the capacitors of the memory cells are shared to the bit line BL. A potential on the bit line BL is pulled up to the power supply voltage Vary by an SA sensing action of the sense amplifier, and meanwhile, a potential on a complementary bit line/BL is pulled down to a power supply voltage Vss by the SA sensing amplification action of the sense amplifier. At the beginning of tWR time, the write driver is turned on (Write driver on), and within the CSL ON time, the bit line BL is strobed (YS ON) to receive a voltage of the input terminal. Next, the write driver is turned off (Write driver off). After the tWR time, the memory row address strobe precharge time (tPR) is reached. Within the tPR time, the word line is turned off (WL OFF), the sense amplifier is turned off (SA OFF), and the bit line equalization signal is turned on (BLEQ ON), such that a potential of the bit line is pulled down to an intermediate potential (VBLE).

As can be seen from FIG. 2, when reverse writing is performed on the target memory cell into which the first data "1" have been stored, within the tRCD time, the potential of the bit line is pulled up to Vary due to the charge sharing of the target memory cell and the amplification action of the sense amplifier.

Next, within the write recovery time of reversely writing "0", the write driver is first turned on. Next, the CSL control signal is turned on. Meanwhile, the word line signal of the target memory cell has been turned on within the tRCD time before. Therefore, within the CSL ON time, the input terminal is connected to the capacitor of the target memory cell, such that the capacitor of the target memory cell discharges, and the signal of the bit line is pulled down.

During reverse writing, the CSL ON time is standard reference time, which is reference time for determining whether the memory cells meet standards. The time may be set according to customer requirements or internal product requirements, etc., for an ideal target memory cell, referring to FIG. 2A, the capacitor in the memory cell discharges faster within the CSL ON time, and the signal of the bit line is pulled down faster. At this moment, after the CSL ON time ends (i.e., after the CSL control signal is turned off), the voltage of the bit line BL is lower than the voltage of the complementary bit line/BL. Next, the potential of the bit line of the memory cell is pulled down to Vss by the amplification action of the sense amplifier, such that the target memory cell completely discharges and "0" is reversely written into the target memory cell, and the potential of the complementary bit line is pulled up to Vary by the amplification action of the sense amplifier. Next, the sense amplifier and the word line are turned off, and an equalization circuit is turned on, such that the voltage of the bit line is equal to the voltage of the complementary bit line, that is, both are equal to VCC/2 (i.e., the intermediate potential between Vary and Vss).

Figure 2B:
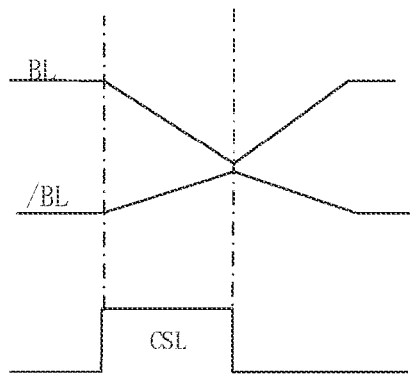
FIG. 2B is a schematic timing diagram showing a bit line and a complementary bit line within write recovery time when the reverse writing is performed on the target memory cell according to one embodiment.

Referring to FIG. 2B, when the discharging of the capacitor in the memory cell is hindered within the CSL ON time, the pull-down speed of the voltage of the bit line corresponding to the target memory cell is slower. At this moment, after the CSL ON time ends (i.e., after the CSL control signal is turned off), the voltage of the bit line BL is still greater than the voltage of the complementary bit line/BL. At this moment, after the CSL ON time ends (that is, after the CSL control signal is turned off), the sense amplifier may pull up the voltage of the bit line to Vary again to charge the target memory cell, and the voltage of the complementary bit line may be pulled down to Vss. The sense amplifier pulls the voltage of the bit line up to Vary again, such that the target memory cell is recharged. Thus, "1" may be erroneously written into the target memory cell before the sense amplifier and the word line are turned off and before the equalization circuit is turned on.

In the Step S40, when the CSL ON time during the reverse writing is the standard reference time, the data reversely written into the target memory cell are read. When the first data are "1", if the second data read are "0", this means that the target memory cell does not fail when the CSL ON time is the standard reference time, and thus the standard requirements can be met. However, if the second data read are "1", this means that the target memory cell fails because of hindered discharging of its capacitor when the CSL ON time is the standard reference time, and thus the standard requirements cannot be met.

In the Step S50, when the first data are "1", it is determined whether the second data read in the Step S40 are "1", such that it may be determined whether the write recovery time of the target memory cell fails.

In the Step S60, when the first data are "1", it may be seen by an analysis from the foregoing reverse writing process that when the second data are the same as the first data (both are "1"), the target memory cell fails because of hindered discharging of its capacitor when the CSL ON time is the standard reference time.

A detailed description is made by taking an example where the first data are "1", and its principle process is similar to the above process when the first data are "0".

When the first data are "0", it may be seen by an analysis from the foregoing reverse writing process that when the second data are the same as the first data (both are "0"), the target memory cell fails because of hindered discharging of its capacitor when the CSL ON time is the standard reference time.

In this embodiment, the first data "1" (or "0") are first written into the target memory cell, and then reverse writing is performed on the target memory cell. When the CSL ON time is the standard reference time, within the CSL ON time, the discharging (or charging) process of the capacitor of the target memory cell is hindered, which may cause that the voltage reversal speed of the bit line corresponding to the target memory cell becomes slow, such that a relationship between the potential of the bit line and the potential of the complementary bit line is not reversed after the CSL time of the write recovery time of the reverse writing is ended. Within the write recovery time after the CSL time is ended, under the action of the sense amplifier between the bit line and the complementary bit line, the potential of the bit line returns to the power supply voltage Vary (or the power supply voltage Vss corresponding to the first data "0") corresponding to the first data "1". At this moment, the bit line having the power supply voltage Vary (or the power supply voltage Vss) corresponding to the first data may allow the first data to be written into the target memory cell again because the word line is turned on, such that the reverse writing to the target memory cell fails. Therefore, by reading the second data stored in the target memory cell after the reverse writing and comparing whether the second data are the same as the first data, it may be effectively determined whether the target memory cell fails due to hindered charging when the CSL ON time is the standard reference time.

Figure 3:
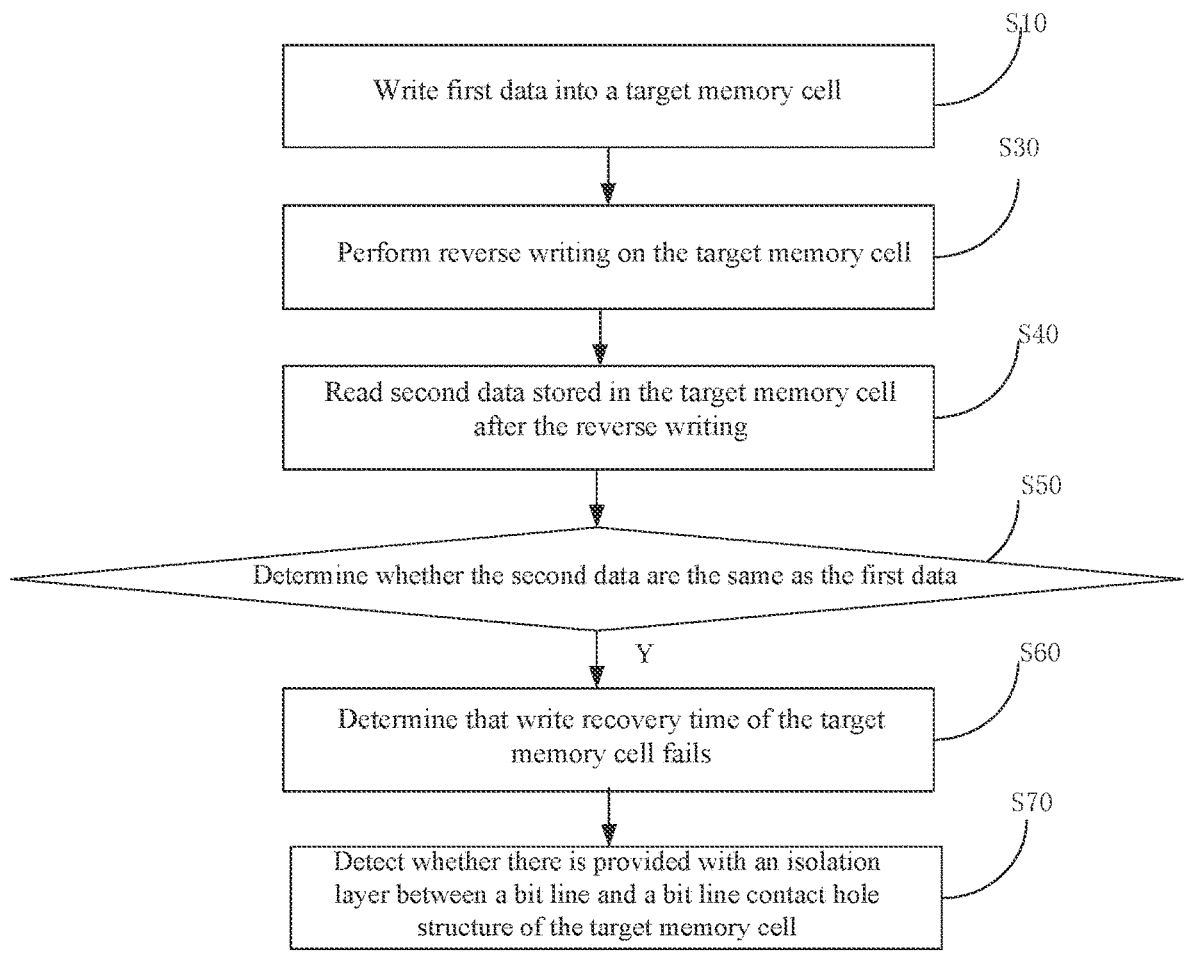
FIGS. 3 to 6 are schematic flowcharts of the test method according to other different embodiments.

In this embodiment, referring to FIG. 3, after the Step S60, the method also includes:

Step S70: detecting whether there is provided with an isolation layer between a bit line and a bit line contact hole structure of the target memory cell.

When the isolation layer is formed between the bit line and the bit line contact hole of the target memory cell due to residual by-products therebetween, a resistance between the bit line and the bit line contact hole may be increased. Therefore, when there is a defect such as the isolation layer between the bit line and the bit line contact hole structure of the target memory cell, charging of the memory cell may be hindered.

Therefore, in the Step S60, when it is determined that the target memory cell fails due to hindered charging when the CSL ON time is the standard reference time, this may likely be caused by the isolation layer between the bit line and the bit line contact hole of the target memory cell (of course, hindered charging of the memory cell may also be caused by other reasons).

Therefore, the determining that write recovery time of the target memory cell fails in the Step S60 may serve as a basis for determining whether there is provided with the isolation layer between the bit line and the bit line contact hole structure.

In one embodiment, after the Step S10 and before the Step S30, the method also includes:

Step S01: setting the CSL ON time less than preset time.

As an example, the "preset time" may be maximum time stipulated by Joint Electron Device Engineering Council (JEDEC), or may be less than maximum ON time of the JEDEC.

If the target memory cell does not fail when the CSL ON time is less than the preset time, generally the target memory cell does not fail when the CSL ON time is equal to the preset time. Therefore, in this embodiment, a more reliable failure determination of the target memory cell may be performed by means of the CSL ON time shortened.

Figure 4:
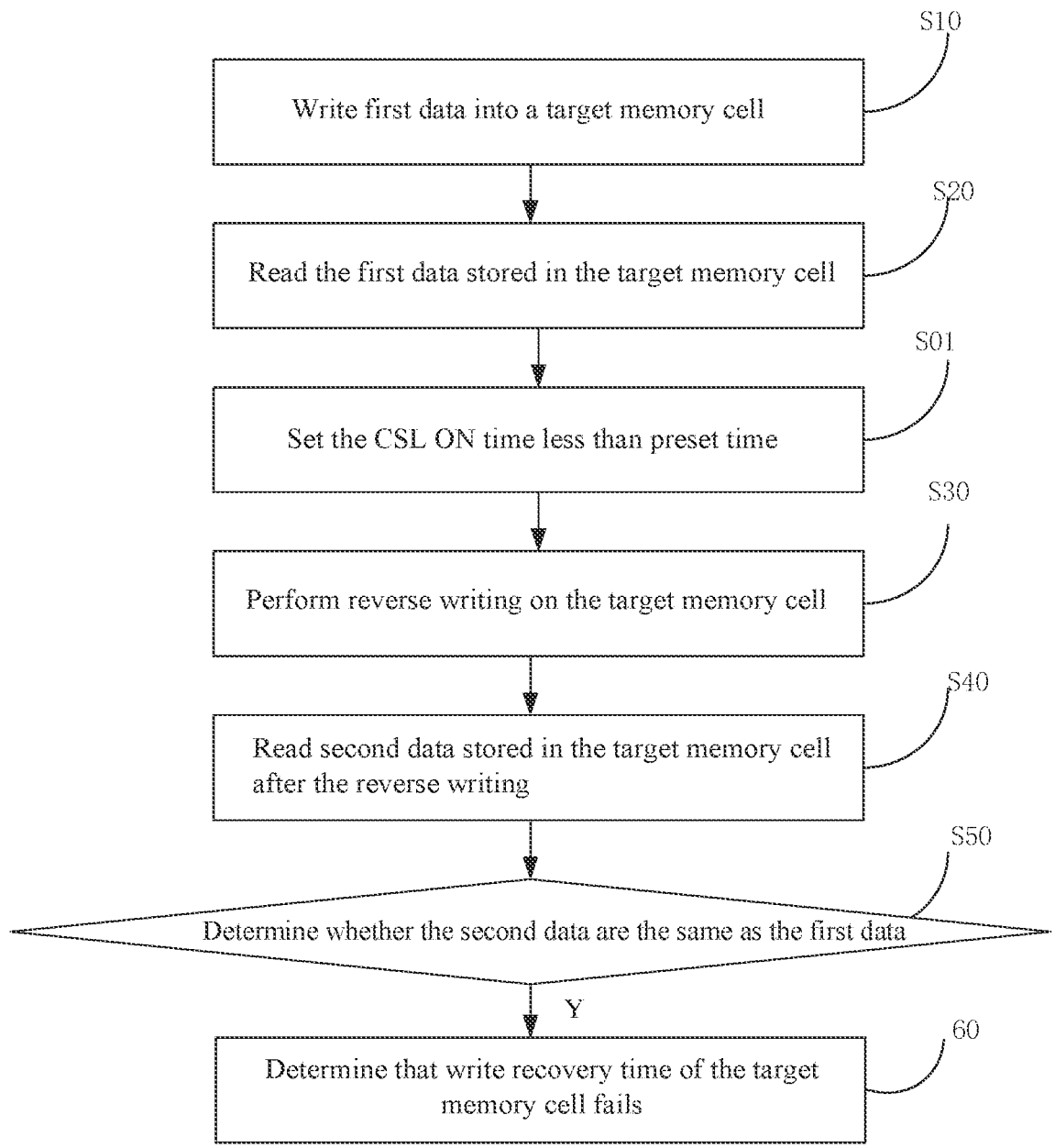

In one embodiment, referring to FIG. 4, after the Step S10 and before the Step S30, the method also includes:

Step S20: reading the first data stored in the target memory cell.

At this moment, it may be confirmed whether the first data are successfully written into the target memory cell to ensure that a test result is accurate.

In some embodiments, when the first data are "1", in the process of reading the target memory cell, within the tRCD time, in the charge sharing stage, charges corresponding to "1" are shared on the bit line, such that the voltage of the bit line is pulled up. Under the action of the sense amplifier, rise of the voltage of the bit line causes that the voltage of the complementary bit line is pulled down, and that the voltage of the bit line is further pulled up. Based on such an interaction, a potential difference between the bit line and the complementary bit line is gradually enlarged, and eventually, the potential of the bit line is pulled up to Vary, and the potential of the complementary bit line is pulled down to Vss.

The tRCD time also may be spent when reverse writing is performed on the target memory cell, and within the tRCD time, the potential of the bit line is reversed from Vary to Vss.

Figure 5:
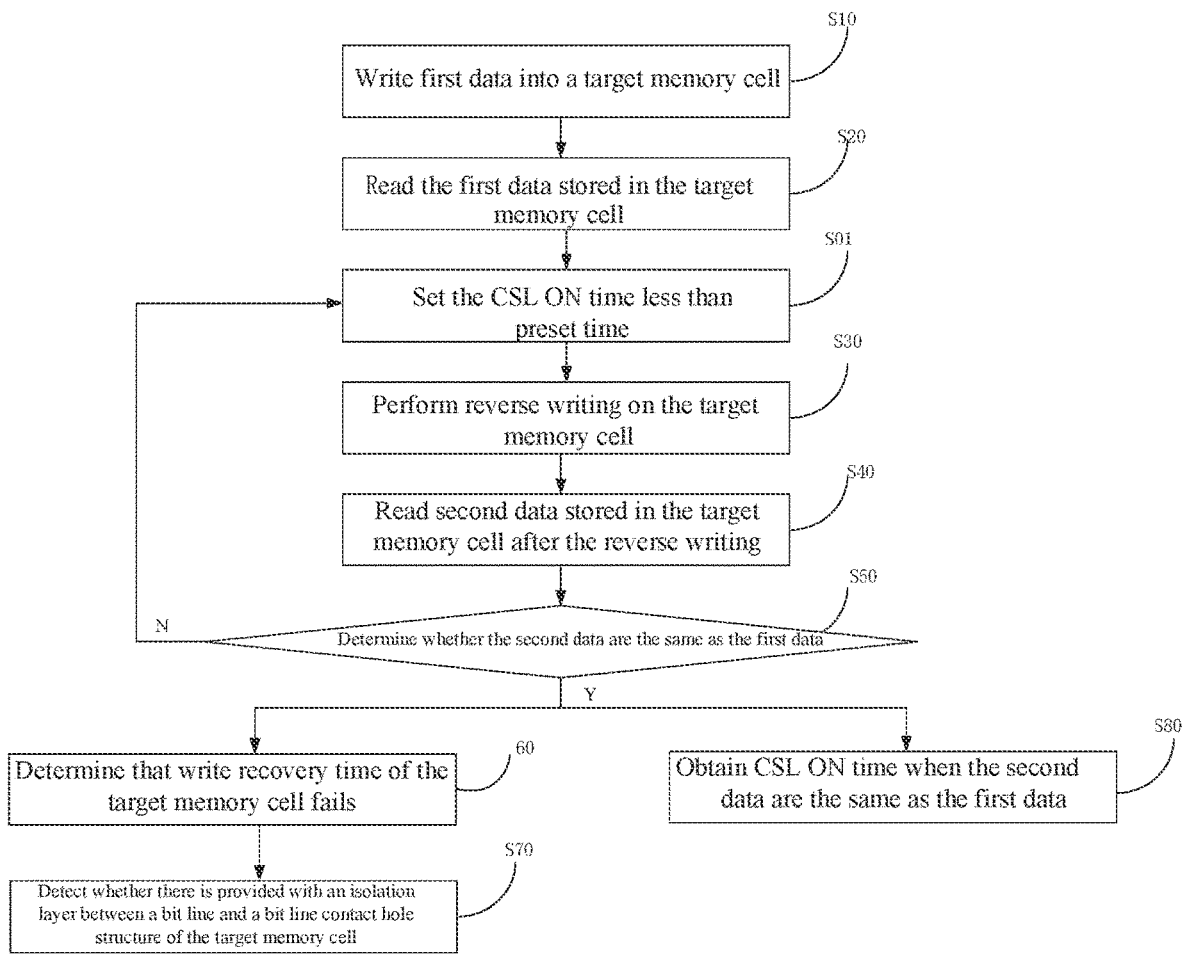

In one embodiment, referring to FIG. 5, after the Step S50, the method also includes:

Step S80: when the second data are different from the first data, setting the CSL ON time again to shorten the CSL ON time until the second data are the same as the first data, to obtain CSL ON time when the second data are the same as the first data.

As an example, before the second data are the same as the first data, each time the CSL ON time may be shortened by the same time length. Of course, this is not limited here.

Meanwhile, when the CSL ON time is set for the target memory cell for one or more times, the CSL ON time set for the first time is used as the standard reference time. Subsequently, the CSL ON time may be shortened on the basis of the standard reference time.

In this embodiment, by shortening the CSL ON time, a limit value of the normal CSL ON time of the target memory cell may be obtained, such that a limit value of the normal write recovery time of the target memory cell may be obtained.

Figure 6:
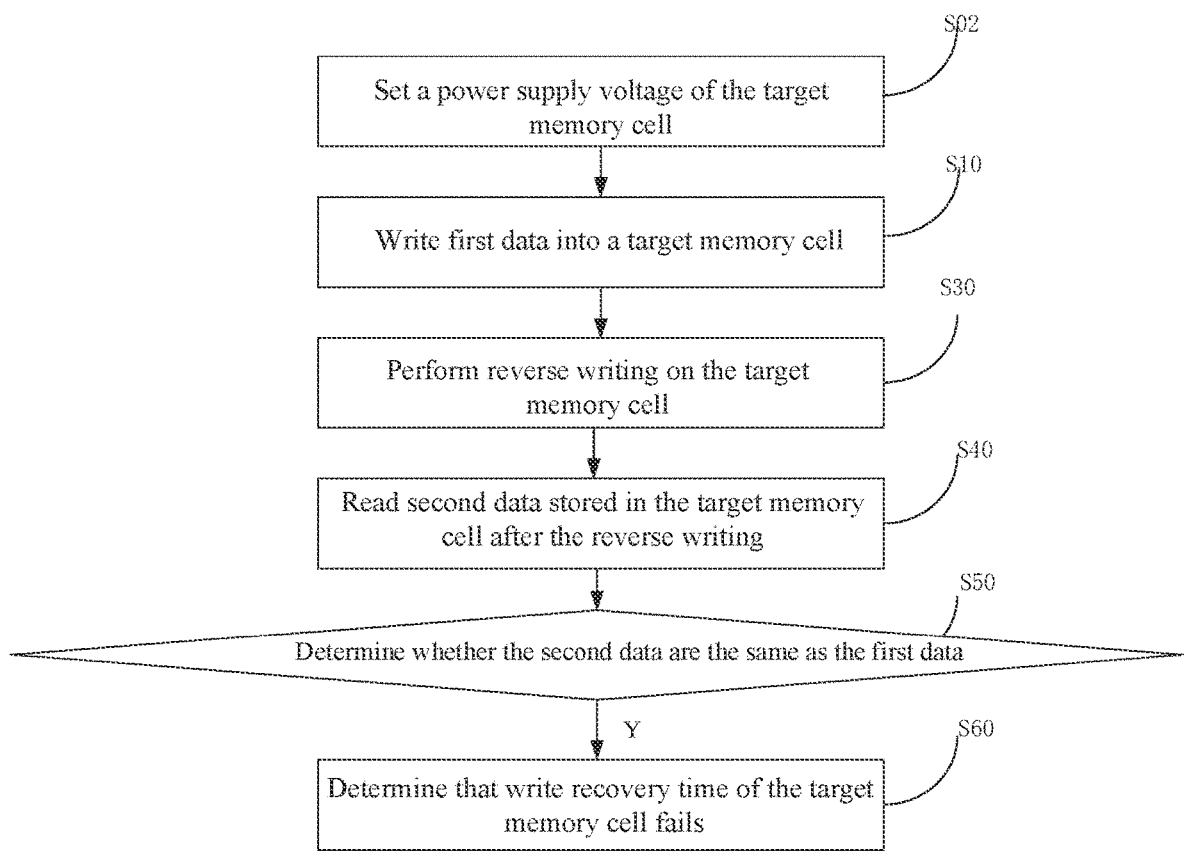

In one embodiment, referring to FIG. 6, before the Step S10, the method also includes:

Step S02: setting a power supply voltage of the target memory cell.

In some embodiments, when the first data are "1", the power supply voltage Vary of the target memory cell may be set to be lower than a first preset voltage.

At this moment, electric quantity when the first data "1" are written into the target memory cell can be reduced. Therefore, when reverse writing of data "0" is performed on the target memory cell at this moment, a voltage difference between the capacitor and the bit line is reduced. However, a larger voltage difference between the capacitor and the bit line and a stronger action of electric field make it easier to form a conductive path and alleviate the problem of hindering the discharging of the capacitor caused by defects such as presence of the isolation layer. Therefore, if the target memory cell does not fail in this case, it also does not fail under the first preset voltage. At this moment, test reliability can also be effectively improved.

When the first data are "0", the power supply voltage Vss of the target memory cell may be set to be higher than a second preset voltage.

At this moment, electric quantity when the first data "0" are written into the target memory cell can be increased. Therefore, when reverse writing of data "1" is performed on the target memory cell at this moment, the voltage difference between the capacitor and the bit line is reduced. However, a larger voltage difference between the capacitor and the bit line and a stronger action of electric field make it easier to form a conductive path. Therefore, if the target memory cell does not fail in this case, it also does not fail under the second preset voltage. At this moment, the test reliability can also be effectively improved.

In one embodiment, in the Step S10, while the first data are written into the target memory cell, data opposite to the first data are also written into all other memory cells positioned around and adjacent to the target memory cell.

As an example, the first data may be set as "1", and the data opposite to the first data may be set as "0". At this moment, "1" is written into the target memory cell, and "0" is written into all the other memory cells positioned around and adjacent to the target memory cell. Meanwhile, due to electrical coupling between the target memory cell and the surrounding memory cells, charges in the target memory cell may leak to the surrounding memory cells, such that quantity of charges stored in the target memory cell is reduced, which in turn leads to a smaller voltage difference between the voltage of the bit line and the voltage of the target memory cell in a subsequent reverse writing process.

Of course, the first data may be set as "0", and the data opposite to the first data may be set as "1". At this moment, "0" is written into the target memory cell, and "1" is written into all the other memory cells positioned around and adjacent to the target memory cell. Meanwhile, due to the electrical coupling between the target memory cell and the surrounding memory cells, positive charges of the other memory cells around the target memory cell will be transferred to the target memory cell, such that the quantity of charges stored in the target memory cell is increased, which in turn leads to a smaller voltage difference between the voltage of the bit line and the voltage of the target memory cell in the subsequent reverse writing process.

Therefore, if the target memory cell does not fail in this case, in other cases when the voltage difference between the target memory cell and the bit line is greater, the target memory cell is less likely to fail. At this moment, the test reliability can also be effectively improved.

In one embodiment, in the Step S10, data are written into a target memory array in an X-fast manner, such that the first data are written into the target memory cell and the data opposite to the first data are written into all other memory cells in the target memory array.

Figure 7:
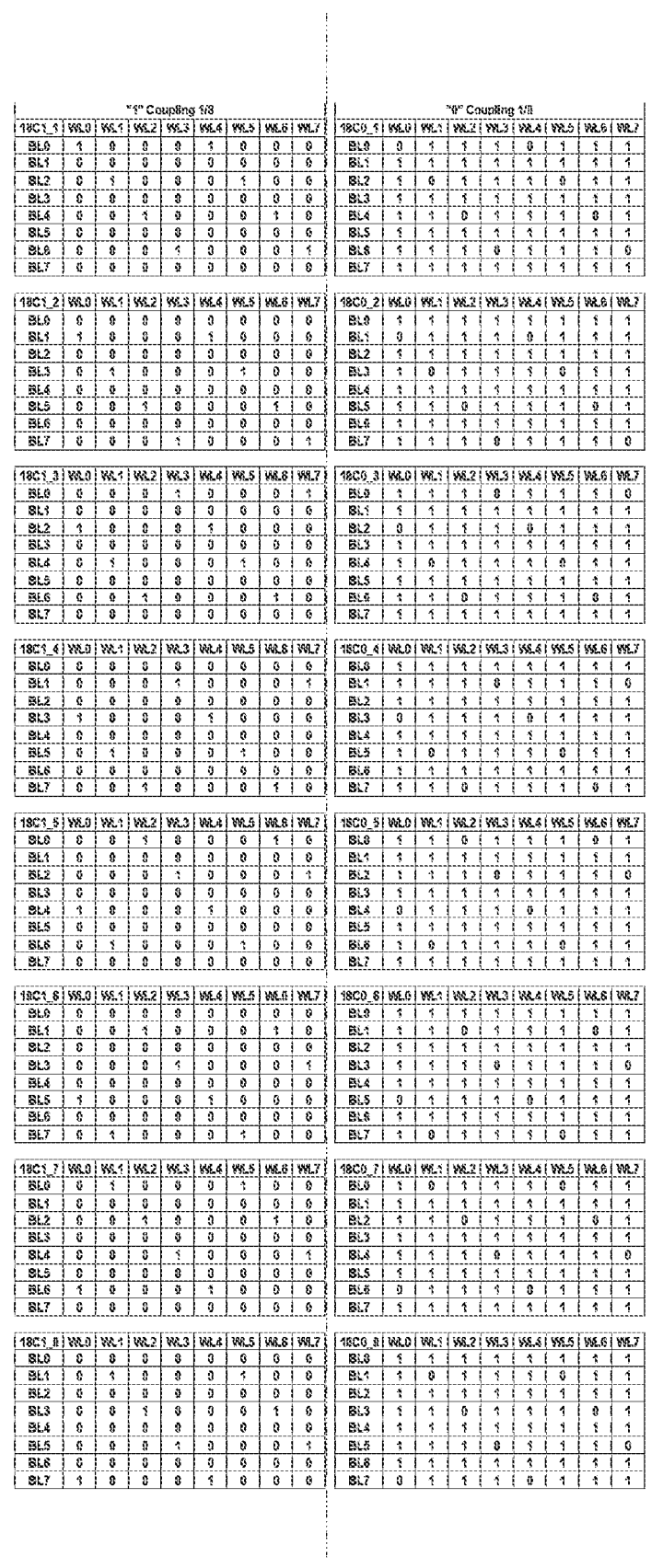

In some embodiments, the target memory array includes a plurality of memory cells, and the plurality of memory cells include several target memory cells. Referring to FIG. 7, a left side of a dotted line shows a schematic diagram where data "1" are written into the target memory cell and the data "0" opposite to the data "1" are written into all the other memory cells in the target memory array in the X-fast manner; and a right side of the dotted line shows a schematic diagram where data "0" are written into the target memory cell and the data "1" opposite to the data "0" are written into all the other memory cells in the target memory array in the X-fast manner.

Using the X-fast manner means to sequentially write a burst length to each word line in the target memory array, and then to start from the beginning after completing bit line writing of burst length bits. The X-fast manner has a slower writing speed but has a better writing quality, so reliability of test results can be improved.

In one embodiment, a to-be-tested memory device includes a plurality of memory banks, and each of the plurality of memory banks includes a plurality of memory arrays.

Before the data are written into the target memory array in the X-fast manner in the Step S10, the method also includes:

Step S03: determining a target memory bank from the plurality of memory banks; and Step S04: determining the target memory array from the plurality of memory arrays of the target memory bank.

In this embodiment, for the target memory bank, after it is determined whether all target memory cells of the target memory array fail according to a fact whether the second data are the same as the first data, the target memory array may be replaced in the plurality of memory arrays of the target memory bank until it is determined whether all the target memory cells of the plurality of memory arrays of the target memory bank fail according to the fact whether the second data are the same as the first data. Next, the target memory bank may be replaced until it is determined whether all the target memory cells of the plurality of memory banks of the to-be-tested memory device fail according to the fact whether the second data are the same as the first data. In this way, test of the entire to-be-tested memory device can be completed.

In one embodiment, before the data are written into the target memory array in the X-fast manner in the Step S10, the method also includes:

Step S05: writing "0" to all the memory cells of the to-be-tested memory device.

At this moment, all the memory cells may be kept in the same state, and adverse effects of voltage noise can be eliminated.

As an example, the data "0" may be written into all the memory cells in a Y-fast manner. The Y-fast manner means to write up one word line, and then to write a next word line. The Y-fast manner has a faster writing speed, and thus can effectively improve the test efficiency.

Of course, other writing manners (such as the X-fast manner) may also be used to write "0" into all the memory cells of the to-be-tested memory device, which is not limited here.

In one embodiment, after the Step S05, the method also includes:

Step S06: refreshing all the memory cells of the to-be-tested memory device.

At this moment, it can be further ensured that all the memory cells are kept in the same state, and the adverse effects of the voltage noise can be eliminated.

Here, before the data are written into the target memory array in the X-fast manner in the Step S10, the method also includes the Step S03 and the Step S04, and the Step S03 may be provided after the Step S06. In this case, when cyclic test is performed on each of the plurality of memory banks and each of the plurality of memory arrays, it is not necessary to repeat the operations, thereby improving test efficiency.

In one embodiment, before the Step S05, the method also includes:

Step S07: removing residual information for all the memory cells of the to-be-tested memory device, and initializing the to-be-tested memory device.

At this moment, disturbing effects caused by external factors can be effectively avoided.

In some embodiments, residual information is removed for all the memory cells even if they are in an intermediate state between "0" and "1". The initializing the to-be-tested memory device is equivalent to removing the residual information of registers, and so on.

Figure 8:
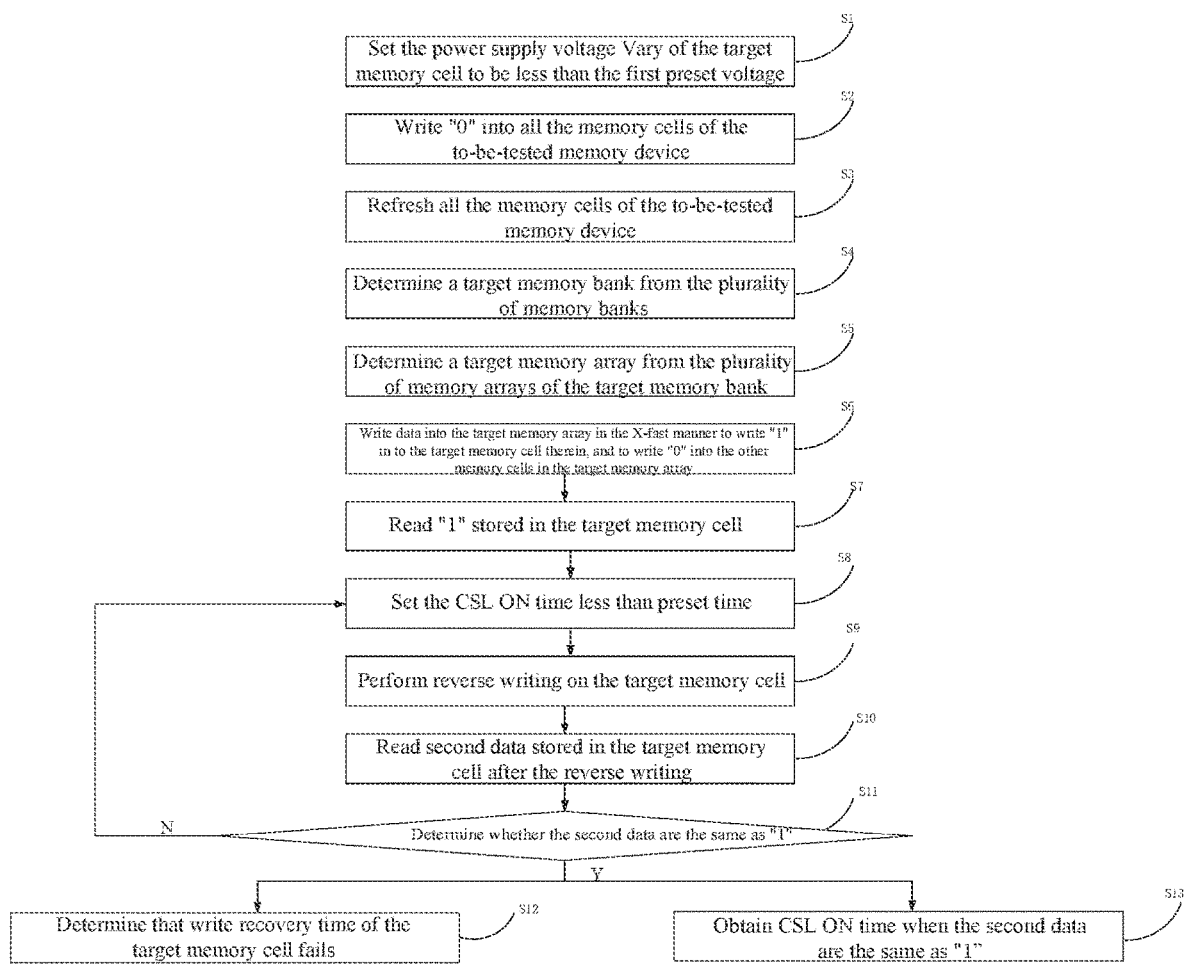
FIG. 8 is a schematic flowchart of a test method according to yet another embodiment.

In one embodiment, referring to FIG. 8, a test method is provided, including:

Step S1: setting the power supply voltage Vary of the target memory cell to be less than the first preset voltage;

Step S2: writing "0" into all the memory cells of the to-be-tested memory device;

Step S3: refreshing all the memory cells of the to-be-tested memory device;

Step S4: determining a target memory bank from the plurality of memory banks;

Step S5: determining a target memory array from the plurality of memory arrays of the target memory bank;

Step S6: writing data into the target memory array in the X-fast manner to write "1" in to the target memory cell therein, and to write "0" into the other memory cells in the target memory array;

Step S7: reading "1" stored in the target memory cell;

Step S8: setting the CSL ON time less than preset time;

Step S9: performing reverse writing on the target memory cell;

Step S10: reading second data stored in the target memory cell after the reverse writing;

Step S11: determining whether the second data are the same as "1";

Step S12: determining that write recovery time of the target memory cell fails when the second data are the same as "1"; and Step S13: when the second data are different from "1", setting the CSL ON time again to shorten the CSL ON time until the second data are the same as "1", to obtain CSL ON time when the second data are the same as "1".

Next, the target memory array in the target memory bank may be replaced, and the above Steps S6 to S13 are repeated until the test of all the plurality of memory arrays in the target memory bank is completed. Next, the target memory bank may be replaced until the test of all the plurality of memory banks is completed.

In this embodiment, a limit value of the normal CSL ON time of each of the target memory cells in the to-be-tested memory device may be obtained, such that a limit value of the normal write recovery time of each of the target memory cells in the to-be-tested memory device may be obtained.

It is to be understood that although the various steps in the flowcharts are displayed in sequence as indicated by the arrows, these steps are not necessarily performed in sequence in the order indicated by the arrows. It should be understood that unless expressly stated herein, the execution of these steps is not strictly limited in sequence, and these steps may be performed in other orders. Moreover, at least a part of the steps in FIG. 5 may include a plurality of steps or a plurality of stages, which are not necessarily performed at the same moment, but may be executed at different moments, and the order of execution of these steps or stages is not necessarily performed sequentially, but may be performed alternately or alternately with other steps or at least a part of the steps or stages of other steps.

In one embodiment, there is also provided a computer device including a memory and a processor, where the memory stores a computer program, and the computer program is executable by the processor, whereby the steps of the method provided by any one of the above embodiments are implemented.

In one embodiment, there is also provided a computer-readable storage medium storing a computer program thereon, the computer program is executable by a processor, whereby the steps of the method provided by any one of the above embodiments are implemented.

Those of ordinary skill in the art may understand that implementation of all or some flows in the method according to the foregoing embodiments may be achieved by instructing relevant hardware by a computer program, wherein the computer program may be stored in a non-transitory computer-readable storage medium, and when the computer program is executed, the flows of the embodiments of the foregoing methods may be included. Any reference to memory, storage, database or other media used in the embodiments provided in the present disclosure may include nonvolatile and/or volatile memory. The nonvolatile memory may include read-only memory (ROM), magnetic tape, floppy disk, flash memory, or optical memory, and the like. The volatile memory may include random access memory (RAM) or external cache memory. As an illustration and not as a limitation, the RAM may be in various forms, such as static random access memory (SRAM) or dynamic random access memory (DRAM), etc.

In the description of this specification, reference to the description of the terms "some embodiments", "other embodiments", "ideal embodiments", etc. means that a particular feature, structure, material or feature described in connection with the embodiments or examples is included in at least one embodiment or example of the present disclosure. The schematic representation of the above terms throughout this specification is not necessarily referring to the same embodiment or example.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the patent of the present disclosure shall be merely limited by the appended claims.

What is claimed is:

1. A test method comprising:
writing first data into a target memory cell;
performing reverse writing on the target memory cell;
reading second data stored in the target memory cell after the reverse writing;
determining whether the second data are the same as the first data; and
determining that write recovery time of the target memory cell fails when the second data are the same as the first data; and,
wherein after the determining that write recovery time of the target memory cell fails when the second data are the same as the first data, the test method further comprises:
detecting whether there is provided with an isolation layer between a bit line and a bit line contact hole structure of the target memory cell.

2. The test method according to claim 1, wherein after the writing first data into the target memory cell and before the performing reverse writing on the target memory cell, the test method comprises:
setting CSL ON time less than preset time.

3. The test method according to claim 2, wherein after the determining whether the second data are the same as the first data, the test method further comprises:
when the second data are different from the first data, setting the CSL ON time again to shorten the CSL ON time until the second data are the same as the first data, to obtain CSL ON time when the second data are the same as the first data.

4. The test method according to claim 1, wherein
after the writing first data into the target memory cell and before the performing reverse writing on the target memory cell, the test method further comprises:
reading the first data stored in the target memory cell.

5. The test method according to any one of claim 1, wherein before the writing first data into the target memory cell, the test method comprises:
setting a power supply voltage of the target memory cell.

6. The test method according to claim 1, wherein while writing first data into the target memory cell, data opposite to the first data are written into all other memory cells positioned around and adjacent to the target memory cell.

7. The test method according to claim 6, wherein the first data are represented by "1", the data opposite to the first data being represented by "0".

8. The test method according to claim 6, wherein data are written into a target memory array in an X-fast manner, such that the first data are written into the target memory cell and the data opposite to the first data are written into all other memory cells in the target memory array.

9. The test method according to claim 8, wherein a to-be-tested memory device comprises a plurality of memory banks, each of the plurality of memory banks comprising a plurality of memory arrays; and
before the data are written into the target memory array in the X-fast manner, the test method further comprises:
determining a target memory bank from the plurality of memory banks; and
determining the target memory array from the plurality of memory arrays of the target memory bank.

10. The test method according to claim 8, wherein, before the data are written into the target memory array in the X-fast manner, the test method comprises:
writing "0" into all memory cells of a to-be-tested memory device.

11. The test method according to claim 10, wherein after writing "0" into all memory cells of the to-be-tested memory device, the test method further comprises:
refreshing all the memory cells of the to-be-tested memory device.

12. The test method according to claim 10, wherein before writing "0" into all memory cells of the to-be-tested memory device, the test method further comprises:
removing residual information for all the memory cells of the to-be-tested memory device, and initializing the to-be-tested memory device.

13. A computer apparatus comprising a memory storing a computer program and a processor, the computer program is executable by the processor to implement a test method according to claim 1.

14. A non-transitory computer-readable storage medium, storing a computer program thereon, the computer program is executable by a processor to implement a test method according to claim 1.

15. A test method comprising:
writing first data into a target memory cell;
performing reverse writing on the target memory cell;
reading second data stored in the target memory cell after the reverse writing;
determining whether the second data are the same as the first data; and
determining that write recovery time of the target memory cell fails when the second data are the same as the first data;
wherein after the writing first data into the target memory cell and before the performing reverse writing on the target memory cell, the test method comprises:
setting CSL ON time less than preset time;
wherein after the determining whether the second data are the same as the first data, the test method further comprises:
when the second data are different from the first data, setting the CSL ON time again to shorten the CSL ON time until the second data are the same as the first data, to obtain CSL ON time when the second data are the same as the first data.

16. A computer apparatus comprising a memory storing a computer program and a processor, the computer program is executable by the processor to implement a test method according to claim 15.

17. A non-transitory computer-readable storage medium, storing a computer program thereon, the computer program is executable by a processor to implement a test method according to claim 15.

\* \* \* \* \*